(12) United States Patent
Seong et al.

(10) Patent No.: US 10,826,435 B2
(45) Date of Patent: Nov. 3, 2020

(54) BIAS CIRCUIT AND AMPLIFIER

(71) Applicant: SAMSUNG ELECTRO-MECHANICS CO., LTD., Suwon-si (KR)

(72) Inventors: Nack Gyun Seong, Suwon-si (KR); Jong Myeong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 21 days.

(21) Appl. No.: 16/432,260

(22) Filed: Jun. 5, 2019

(65) Prior Publication Data

US 2020/0186093 A1    Jun. 11, 2020

(30) Foreign Application Priority Data

Dec. 11, 2018  (KR) .................. 10-2018-0159265

(51) Int. Cl.
| | | |
|---|---|---|
| *H03G 3/20* | (2006.01) | |
| *H03F 1/02* | (2006.01) | |
| *H03F 3/19* | (2006.01) | |
| *H03F 1/56* | (2006.01) | |
| *H03F 1/32* | (2006.01) | |
| *H03F 1/26* | (2006.01) | |

(52) U.S. Cl.
CPC ............ *H03F 1/0216* (2013.01); *H03F 1/26* (2013.01); *H03F 1/32* (2013.01); *H03F 1/565* (2013.01); *H03F 3/19* (2013.01); *H03F 2200/222* (2013.01); *H03F 2200/294* (2013.01); *H03F 2200/451* (2013.01)

(58) Field of Classification Search
CPC .................................. H03G 3/20; H03F 1/30
USPC .................................................. 330/129, 136
See application file for complete search history.

(56) References Cited

U.S. PATENT DOCUMENTS

| | | | | |
|---|---|---|---|---|
| 6,975,166 | B2 * | 12/2005 | Grillo .................. | H03F 1/0222 330/136 |
| 8,493,142 | B2 * | 7/2013 | Tadano .................. | H03F 3/245 330/136 |
| 8,598,952 | B2 * | 12/2013 | Oh ......................... | H03F 3/181 330/136 |

FOREIGN PATENT DOCUMENTS

KR    10-2008-0078524 A    8/2008

OTHER PUBLICATIONS

Taniguchi, E., et al., "Dual Bias Feed SiGe HBT Low Noise Linear Amplifier", *IEEE Radio Frequency Integrated Circuits Symposium*, 2001, pp. 227-230.

Vuolevi, Joel, et al., "Analysis of Third-Order Intermodulation Distortion in Common-Emitter BJT and HBT Amplifiers", *IEEE Transactions on Circuits and Systems*, Dec. 2003, pp. 994-1001, vol. 50, No. 12.

(Continued)

*Primary Examiner* — Henry Choe
(74) *Attorney, Agent, or Firm* — NSIP Law

(57) ABSTRACT

A bias circuit includes a bias current circuit varying a resistance value according to a mode voltage determined according to a magnitude of an input radio frequency signal, and generating a bias current that is controlled according to the variation of the resistance value; a bias voltage circuit generating a bias voltage that is adjusted according to a change in a power source voltage and supplying the bias voltage to an amplifying circuit; and a bias transfer circuit supplying the bias current to a base node of the amplifying circuit and blocking an input of the radio frequency signal from the base node.

16 Claims, 6 Drawing Sheets

(56) References Cited

OTHER PUBLICATIONS

Maalik, Sohaib, "Structured LNA Design for Next Generation Mobile Communication", *Department of Microtechnology and Nanoscience*, 2013, pp. 1-79.

Huang, Chun-Wen P., et al., "A Compact 5-6 GHz T/R Module Based on SiGe BiCMOS and SOI that Enhances 256 QAM 802.11ac WLAN Radio Front-end Designs", *Skyworks Solutions, Inc.*, pp. 1-4, 2014.

Afaqui, M. Shahwaiz, et al., "IEEE 802.11ax: Challenges and Require ments for Future High Effice ncy WiFi", *IEEE Wireless Communications*, pp. 130-137, Jun. 2017.

\* cited by examiner

BIAS CIRCUIT AND AMPLIFIER

CROSS-REFERENCE TO RELATED APPLICATION

This application claims the benefit under 35 USC § 119(a) of Korean Patent Application No. 10-2018-0159265 filed on Dec. 11, 2018 in the Korean Intellectual Property Office, the entire disclosure of which is incorporated herein by reference for all purposes.

BACKGROUND

1. Field

The following description relates to a bias circuit and an amplifier that improves noise characteristics and linearity characteristics.

2. Description of Related Art

Generally, wireless local area networks (WLANs) or a radio frequency (RF) front-end integrated circuit (FEIC) may include a power amplifier (PA) for amplifying transmission signals, a low noise amplifier (LNA) for amplifying reception signals, and an RF switch.

In order to improve communications speed of the WLAN, development and standardization of communications technology having a wider bandwidth and higher throughput rate are continuously being carried out. Currently, 802.11ac-based WLAN devices that may support up to 6.9 Gbps with technologies such as multiple-input multiple-output (MIMO) and 256 quadrature amplitude modulation (QAM) are used. Additionally, in order to improve a transmission rate and to experience improved communications performance in an indoor/outdoor environment in which access points (APs) and mobile devices are concentrated, it may be beneficial to standardize 802.11ax to which a wider bandwidth and 1024 QAM are applied.

As described above, a modulation technique is improved, and a front-end IC (FEIC) such as a power amplifier (PA), an RF switch, and a low-noise amplifier (LNA) having excellent linearity characteristics may be needed for each of a transmitting end and a receiving end in a mobile device coexisting with various wireless environments.

The low noise amplifier (LNA) located at the receiving end of the typical front-end IC may play an important role that may affect an overall performance of a receiver. Therefore, in order to meet a higher performance needs, low noise characteristics, high voltage gain, and linearity characteristics may be improved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a bias circuit includes a bias current circuit configured to vary a resistance value in response to a mode voltage determined based on a magnitude of an input radio frequency signal, and generate a bias current that is controlled based on the variation of the resistance value, a bias voltage circuit configured to generate a bias voltage that is adjusted based on a change in a power source voltage, and supply the bias voltage to an amplifying circuit, and a bias transfer circuit configured to supply the bias current to a base node of the amplifying circuit, and block an input of the radio frequency signal from the base node.

The bias current circuit may include a resistor circuit configured to have a resistance value that is varied based on the mode voltage, and a current generating circuit configured to generate the bias current based on an internal current determined by the resistance value and a reference voltage.

The resistor circuit may include a first resistor and a second resistor connected in series between a reference voltage terminal and the current generating circuit, and a first switch that is connected in parallel with one of the first resistor and the second resistor, and is configured to switch to an on-state or an off-state based on the mode voltage.

The current generating circuit may include a first transistor that has a first terminal connected to the resistor circuit, a second terminal connected to a ground, and a control terminal connected to the bias transfer circuit.

The current generating circuit may include a first transistor that has a first terminal connected to the resistor circuit, a second terminal connected to a ground, and a control terminal connected to the bias transfer circuit, and a second transistor that has a first terminal connected to a reference voltage terminal, a second terminal connected to the bias transfer circuit, and a control terminal connected to the first terminal of the first transistor.

The bias transfer circuit may include a choke inductor connected between the bias current circuit and the base node of the amplifying circuit, and the current generating circuit further may include a first capacitor connected between the control terminal of the first transistor and the ground.

The first switch may be a field effect transistor (FET) that is configured to turn off when the magnitude of the input radio frequency signal is lower than a reference value, and may be configured to turn on when the magnitude of the input radio frequency signal is higher than the reference value, based on the mode voltage.

In a general aspect, an amplifier includes a detection circuit configured to output a mode voltage based on a magnitude of an input radio frequency signal, a bias circuit configured to generate a bias current based on the mode voltage, and an amplifying circuit configured to receive the bias current, wherein the bias circuit includes a bias current circuit configured to vary a resistance value based on the mode voltage, and generate a bias current that is controlled based on the variation of the resistance value, a bias voltage circuit configured to generate a bias voltage that is adjusted based on a change in a power source voltage, and a bias transfer circuit configured to supply the bias current to a base node of the amplifying circuit, and block an input of the radio frequency signal from the base node.

The bias current circuit may include a resistor circuit configured to have a resistance value that is varied based on the mode voltage, and a current generating circuit configured to generate the bias current based on an internal current determined by the resistance value and a reference voltage.

The resistor circuit may include a first resistor and a second resistor connected in series between a reference voltage terminal and the current generating circuit, and a first switch connected in parallel with one of the first resistor and the second resistor and is configured to switch to an on-state or an off-state based on the mode voltage.

The current generating circuit may include a first transistor that has a first terminal connected to the resistor circuit, a second terminal connected to a ground, and a control terminal connected to the bias transfer circuit.

The current generating circuit may include a first transistor that has a first terminal connected to the resistor circuit, a second terminal connected to a ground, and a control terminal connected to the bias transfer circuit, and a second transistor that has a first terminal connected to a reference voltage terminal, a second terminal connected to the bias transfer circuit, and a control terminal connected to the first terminal of the first transistor.

The bias transfer circuit may include a choke inductor connected between the bias current circuit and a base node of the amplifying circuit, and the current generating circuit may further include a first capacitor connected between the control terminal of the first transistor and the ground.

The amplifying circuit may include an amplifying transistor circuit including a first amplifying transistor and a second amplifying transistor that are connected in a cascode structure between a power source voltage terminal and a ground, the first amplifying transistor is configured to amplify the radio frequency signal, and the second amplifying transistor is configured to output the amplified radio frequency signal, and an impedance matching circuit including a first inductor connected to an input node of the first amplifying transistor, and a second inductor connected to a ground node of the first amplifying transistor.

The bias voltage circuit may include a voltage drop circuit connected between a power source voltage terminal and an output node of the bias voltage circuit, a second capacitor connected between the output node of the bias voltage circuit and the ground, and a second switch connected in parallel to the voltage drop circuit and configured to switch to an on-state or an off-state based on a difference voltage between a reference voltage and a voltage of the output node.

The voltage drop circuit may include first and second diode-connected transistors connected in series between the power source voltage terminal and the output node of the bias voltage circuit.

Other features and aspects will be apparent from the following detailed description, the drawings, and the claims.

Figure 1:
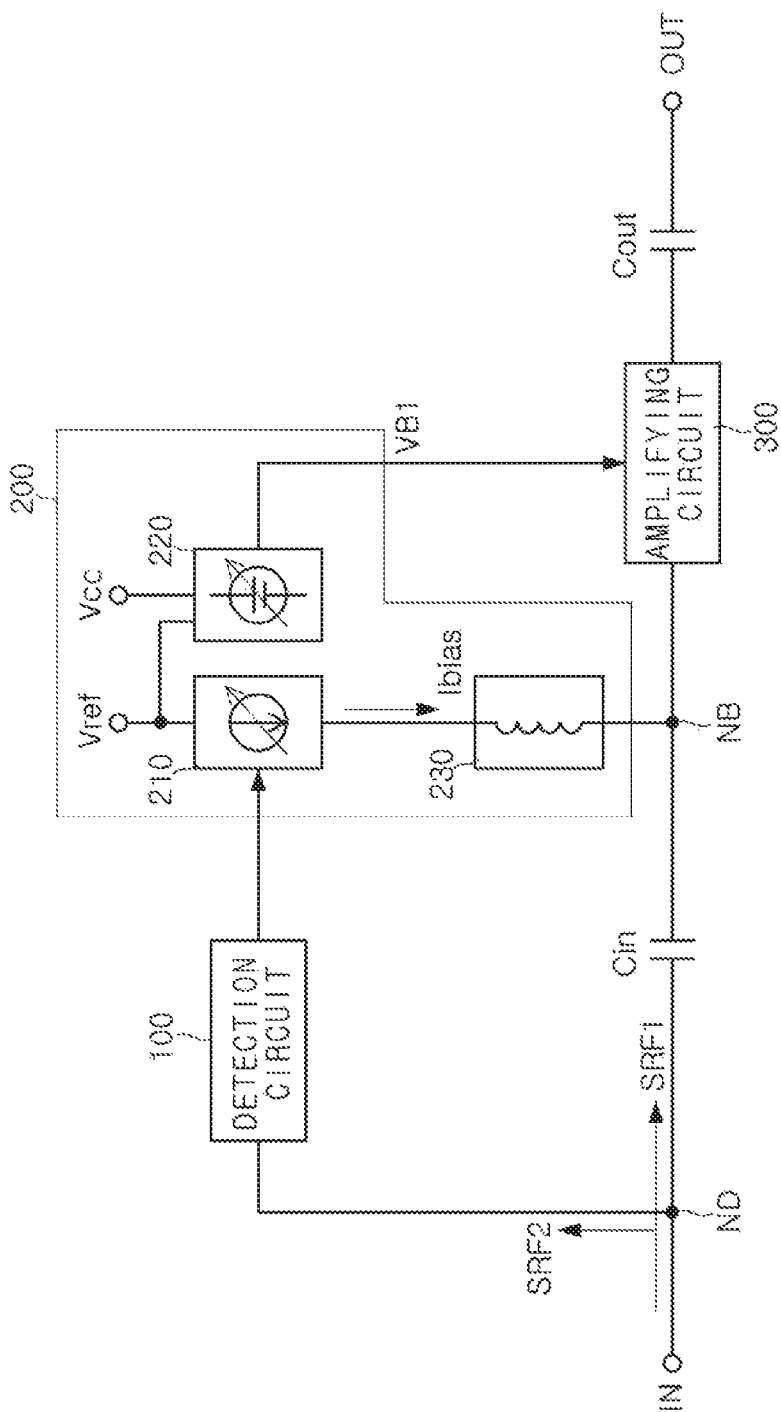
FIG. 1 is a diagram illustrating an example of a bias circuit and an amplifier in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

FIG. 1 is a diagram illustrating an example of a bias circuit and an amplifier. in accordance with one or more embodiments. Referring to FIG. 1, an amplifier, according to an example, may include a detection circuit 100, a bias circuit 200, and an amplifying circuit 300.

The detection circuit 100 may receive a radio frequency signal SRF2 from a detection node ND connected to an input terminal IN, and may output a mode voltage Vmod based on magnitude of the radio frequency signal SRF2. As an example, in the detection node ND, a first set of radio frequency signals SRF1 of the radio frequency signal SRF may be input to the amplifying circuit 300, and a second set of radio frequency signals SRF2 may be input to the detection circuit 100. The detection node ND may be a signal line connection node that branches a first set of radio frequency signals SRF2 of the radio frequency signal, or may be a coupler that may couple some radio frequency signals SRF2 of the radio frequency signal SRF.

The bias circuit 200 may vary a resistance value according to the mode voltage Vmod, and may generate a bias current $I_{bias}$ controlled according to the variation of the resistance value. As an example, the bias circuit 200 may include a bias current circuit 210, a bias voltage circuit 220, and a bias transfer circuit 230.

The bias current circuit 210 may vary the resistance value according to the mode voltage Vmod determined to switch a mode according to the magnitude of the input radio frequency signal SRF2, and may generate the bias current $I_{bias}$ based on the varied resistance value. Accordingly, the bias current circuit 210 may adaptively vary the bias current $I_{bias}$ according to the magnitude of the radio frequency signal SRF2.

The bias voltage circuit 220 may generate a bias voltage VB1 that is adjusted according to a change in a power source voltage Vcc. That is, the bias voltage circuit 220 may adjust the bias voltage VB1 according to the change in the power source voltage Vcc. In other words, the bias voltage circuit 220 may supply the power source voltage Vcc as the bias voltage VB1 without a voltage drop even when magnitude of the power source voltage Vcc is lowered to some extent, and may thus more stably supply the bias voltage VB1.

As an example, the power source voltage Vcc may be a voltage that is generated by a battery. A detailed description thereof will be provided below.

The bias transfer circuit 230 may supply the bias current $I_{bias}$ to a base node NB of the amplifying circuit 300, and may block a radio frequency signal introduced from the base node NB. As an example, the bias transfer circuit 230 may include a choke inductor $L_{ch}$ connected between the bias current circuit and the base node NB of the amplifying circuit 300. The choke inductor $L_{ch}$ may block the radio frequency signal while supplying the bias current $I_{bias}$. As an example, the choke inductor $L_{ch}$ may have high impedance at a corresponding frequency band.

As a non-limiting example, in FIG. 1, an input capacitor $C_{in}$ may be connected between the detection node ND and the base node NB. The input capacitor $C_{in}$ may have low impedance at a corresponding frequency band of the radio frequency signal SRF, and may have high impedance for direct current (DC) components such as a DC voltage or a DC current.

The amplifying circuit 300 may receive the bias current $I_{bias}$ from the bias circuit 200 through the base node NB, may amplify the radio frequency signal SRF1 which is input through the input terminal IN and the base node NB in sequence, and may output the amplified radio frequency signal SRF1 to an output terminal OUT.

As an example, in FIG. 1, an output capacitor Cout may be connected between the amplifying circuit 300 and the output terminal OUT. The output capacitor Cout may have low impedance at a corresponding frequency band of the radio frequency signal SRF, and may have high impedance for direct current (DC) components such as a DC voltage or a DC current.

In the respective drawings of the present disclosure, unnecessarily overlapped descriptions are possibly omitted for components having the same reference numeral and the same function, and differences in the respective drawings will be described.

In a non-limiting example, the amplifier of the various examples may be applied to a mobile device. Considering a battery usage environment of the mobile device, it may be beneficial to implement an FEIC that operates stably in a wide supply voltage range from 2.5V to 4.75V in the mobile device. The bias voltage circuit 220 may stably provide the bias voltage even in a state in which the magnitude of the power source voltage is low, such that the amplifier may operate at a relatively low voltage and have low power characteristics. As an example, the amplifier according to the present example may be manufactured with a SiGe BiCMOS process.

Additionally, in order for the amplifier to obtain noise characteristics, it is beneficial to have transconductance (gm) of a low value. Accordingly, it may be necessary to maintain low base and collector currents for transistor characteristics. On the other hand, in order to obtain high linearity characteristics, it may be necessary to have gm of a high value and it may be necessary to maintain high base and collector currents, as is typically known.

The bias current circuit 210 may adjust the gm so as to selectively satisfy the low noise characteristic and the high linearity characteristic according to the operation of the low-noise amplifier by adjusting the bias current according to the magnitude of the radio frequency signal, and may implement the low-noise amplifier having an appropriate performance according to a desired situation.

In an example, when a low level of a radio frequency signal is processed, the gm that may be optimized for noise characteristics to have excellent sensitivity characteristics even at low input levels may be set, and on the contrary, when a high level of a radio frequency signal is processed, a high gm that may linearly operate even at high input signals may be set.

Typically, when the bias current of an amplification transistor included in the amplifying circuit is increased, the gm is increased, and when the bias current is decreased, the gm is decreased. As a result, it may be seen that the noise characteristics and the linearity characteristics may be controlled by adjusting the bias current according to the magnitude of the radio frequency signal.

Figure 2:
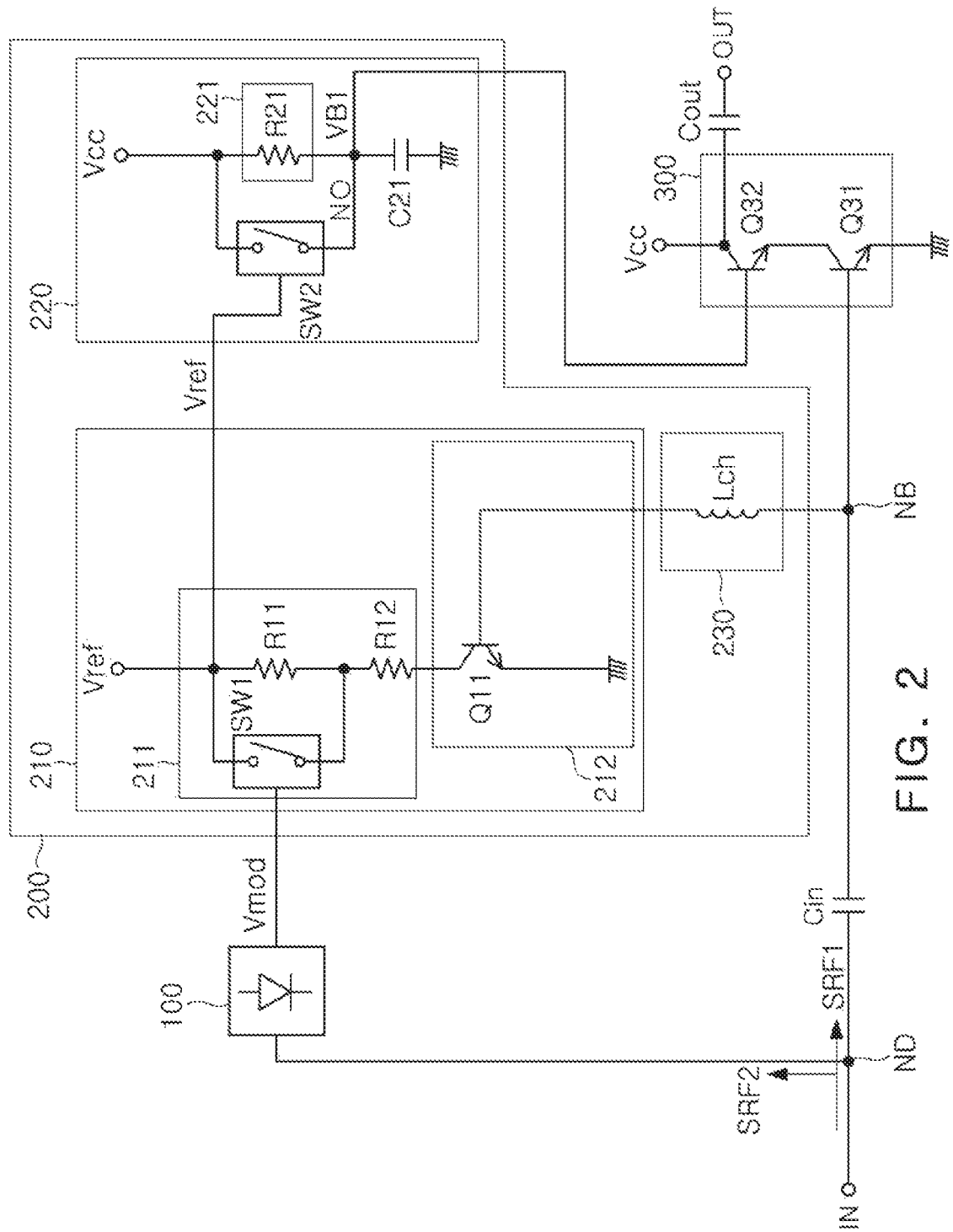
FIG. 2 is a diagram illustrating an example of a bias circuit in accordance with one or more embodiments.

FIG. 2 is a diagram illustrating an example of a bias circuit in accordance with one or more embodiments.

Referring to FIG. 2, the detection circuit 100 may output a mode voltage $V_{mod}$ for mode switching based on the magnitude of the input radio frequency signal SRF.

As an example, the detection circuit 100 may provide a mode voltage $V_{mod}$ having a switching off level when the magnitude of the radio frequency signal is lower than a reference value, and may provide a mode voltage $V_{mod}$ having a switching on level when the magnitude of the radio frequency signal is higher than the reference value.

In addition, as an example, the detection circuit 100 may be a rectifying circuit including a rectifying diode. As an example, the magnitude of the radio frequency signal SRF may be an amplitude of the radio frequency signal SRF, may be an envelope of the radio frequency signal SRF, and may be a peak value of the radio frequency signal SRF, but is not particularly limited to any one thereof.

The bias current circuit 210 may include a resistor circuit 211 and a current generating circuit 212.

The resistor circuit 211 may have a resistance value which is varied according to the mode voltage $V_{mod}$. As an example, the resistance circuit 211 may include a first resistor R11, a second resistor R12, and a first switch SW1. The first resistor R11 and the second resistor R12 may be connected in series between a reference voltage terminal supplied with the reference voltage $V_{ref}$ and the current generating circuit 212. The first switch SW1 may be connected in parallel to any one of the first resistor R11 and the second resistor R12, and may perform an automatic switching operation in an on state or an off state according to the mode voltage $V_{mod}$.

As an example, the first and second resistors R11 and R12 of the resistor circuit 211 may significantly reduce a current deviation due to a temperature change with a "silicided-poly" resistor.

As an example, the first switch SW1 may be a field effect transistor M11 (FIG. 5), but is not limited thereto. The field effect transistor M11 may be turned off when the magnitude of the radio frequency signal is lower than the reference value (e.g., a turn-on voltage) according to the mode voltage $V_{mod}$, and may be turned on when the magnitude of the radio frequency signal is higher than the reference value.

In a non-limiting example, the first switch SW1 may be connected in parallel to the first resistor R11, or may be connected in parallel to the second resistor R12, although not illustrated in the drawings. In the examples described above, the connection position of the first switch SW1 is merely an example and is not limited thereto.

The current generating circuit 212 may generate the bias current $I_{bias}$ based on a resistance value determined by the resistor circuit 211 and an internal current determined by the reference voltage $V_{ref}$.

For example, a sequential operation will be described. When the magnitude of the radio frequency signal is relatively low, the mode voltage $V_{mod}$ may be an off-level voltage. Accordingly, the first switch SW1 may be turned off. When the first switch SW1 is turned off, a resistance value (R11+R12) may be determined by the first and second resistors R11 and R12 of the resistor circuit 211, the internal current may be decreased by a constant reference value $V_{ref}$ and a relatively large resistance value (R11+R12), and the bias current $I_{bias}$ may then be decreased. Therefore, according to the description described above, the gm may be decreased. As a result, the noise characteristics may be improved.

On the contrary, when the magnitude of the radio frequency signal is relatively high, the mode voltage $V_{mod}$ may be an on-level voltage. As a result, the first switch SW1 may be turned on. When the first switch SW1 is turned on, a resistance value R12 may be determined by the second resistor R12 of the resistor circuit 211, the internal current may be increased by a constant reference value $V_{ref}$ and a relatively small resistance value R12, and the bias current $I_{bias}$ may then be increased. Therefore, according to the description above, the gm may be increased. As a result, the linearity characteristics may be improved.

As an example, the current generating circuit 212 may include a first transistor Q11. The first transistor Q11 may include a first terminal connected to the resistor circuit 211, a second terminal connected to a ground, and a control terminal connected to the bias transfer circuit 230.

As an example, the first transistor Q11 may form a current mirror with an internal amplifying transistor of the amplifying circuit 300, such that the base current, that is, the bias current $I_{bias}$ may be generated based on a collector current corresponding to an internal current of the first transistor Q11.

In addition, referring to FIG. 2, the bias voltage circuit 220 may include a voltage drop circuit 221, a second capacitor C21, and a second switch SW2. As an example, the second switch SW2 may be a field effect transistor (FET) M21, but is not limited thereto.

The voltage drop circuit 221 may be connected between the power source voltage $V_{cc}$ terminal and an output node $N_o$ of the bias voltage circuit 220 to drop the power source voltage $V_{cc}$ by a predetermined voltage and provide the bias voltage VB1 to the output node $N_o$ of the bias voltage circuit 220. As an example, the voltage drop circuit 221 may include at least one resistor R21. The power source voltage $V_{cc}$ may be dropped by the resistor R21.

The second capacitor C21 may be connected between the output node $N_o$ of the bias voltage circuit 220 and the ground to bypass an alternating current component of the bias voltage VB1 to the ground, and the bias voltage VB1 may be stabilized at the output node $N_o$.

In addition, the second switch SW2 may be connected in parallel to the voltage drop circuit 221, and may be automatically switched to an on state or an off state according to a difference voltage between the reference voltage $V_{ref}$ and the voltage of the output node $N_o$.

As an example, when the power source voltage $V_{cc}$ is sufficiently high, the second switch SW2 may be turned off, and the power source voltage $V_{cc}$ may be dropped by the voltage drop circuit 221 and the bias voltage VB1 may be supplied. As another example, in an example in which the power source voltage $V_{cc}$ is abnormally lowered and it may not be preferable to provide the bias voltage VB1 by causing the voltage drop circuit 221 to drop the power source voltage $V_{cc}$, when the difference voltage between the reference voltage $V_{ref}$ and the voltage of the output node $N_o$ is greater than or equal to a threshold voltage, the second switch SW2 may be automatically turned on, such that the bias voltage VB1 may be supplied through the second switch SW2, which is in the on state, without dropping the power source voltage $V_{cc}$.

Additionally, the amplifying circuit 300 may include a first amplifying transistor Q31 and a second amplifying transistor Q32 that are connected in a cascode structure between the power source voltage $V_{cc}$ terminal and the ground. The first amplifying transistor Q31 may amplify the radio frequency signal, and the second amplifying transistor Q32 may output the amplified radio frequency signal to the output terminal OUT.

Figure 3:
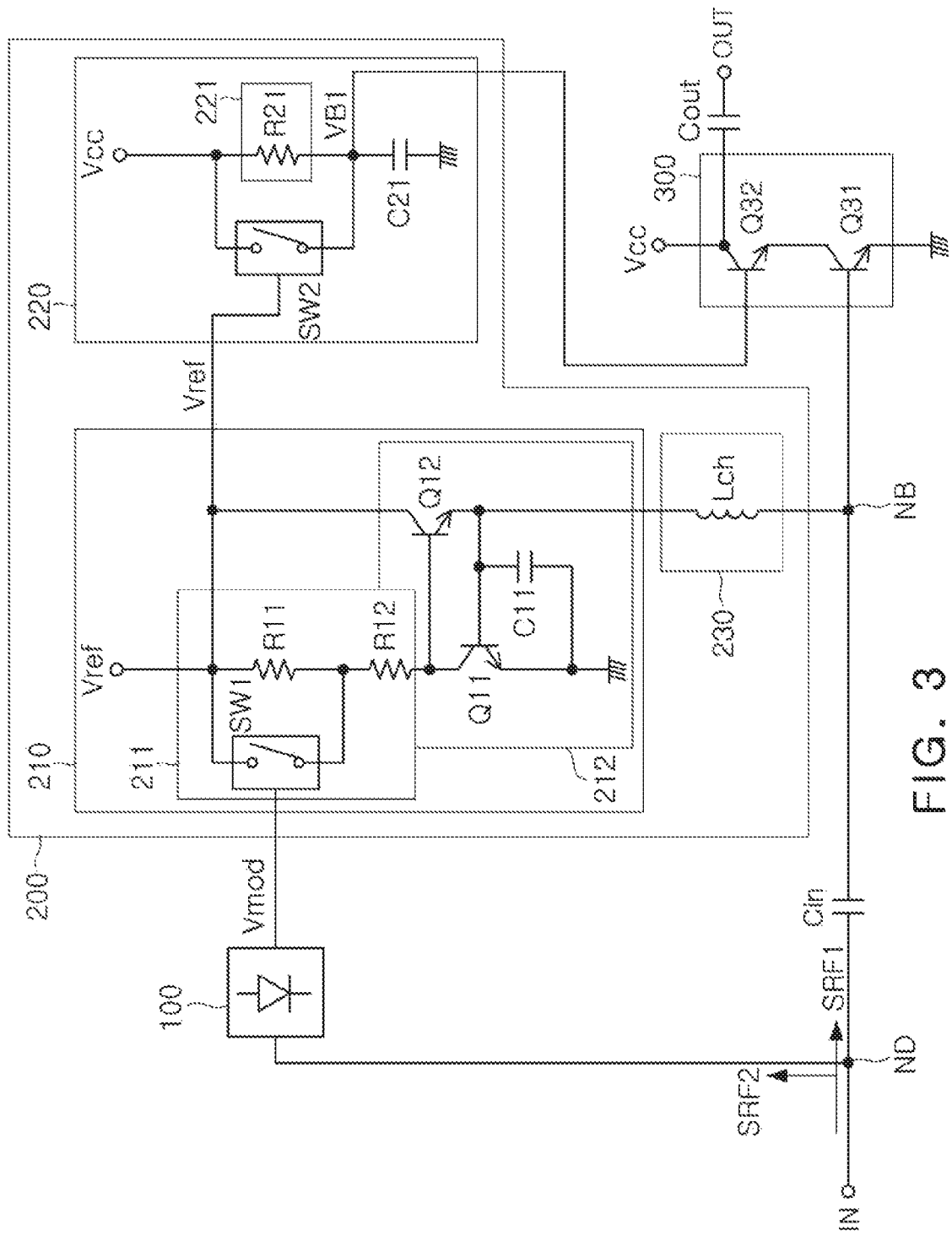
FIG. 3 is a diagram illustrating an example of a bias circuit in accordance with one or more embodiments.

FIG. 3 is a diagram illustrating an example of a bias circuit in accordance with one or more embodiments.

Referring to FIG. 3, the current generating circuit 212 may include a first transistor Q11 and a second transistor Q12.

The first transistor Q11 may include a first terminal connected to the resistor circuit 211, a second terminal connected to a ground, and a control terminal connected to the bias transfer circuit 230.

The second transistor Q12 may include a first terminal connected to a reference voltage terminal supplied with the reference voltage $V_{ref}$, a second terminal connected to the bias transfer circuit 230, and a control terminal connected to the first terminal of the first transistor Q11. In a non-limiting example, the first transistor Q11 and the second transistor Q12 may be bipolar junction transistors (BJTs) manufactured to have the same characteristics. In this example, in the first and second transistors Q11 and Q12, the first terminal may be a collector, the second terminal may be an emitter, and the control terminal may be a base.

According to the circuit illustrated in FIG. 3, an internal current flowing through the first transistor Q11 may be controlled by the second transistor Q12, and a bias current $I_{bias}$ provided through the second transistor Q12 may be controlled by the first transistor Q11.

For example, a sequential operation will be described. When the magnitude of the radio frequency signal is relatively low, the mode voltage Vmod may be an off-level voltage. Accordingly, the first switch SW1 may be turned off. When the first switch SW1 is turned off, a resistance value (R11+R12) may be determined by the first and second resistors R11 and R12 of the resistor circuit 211, the internal current flowing through the first transistor Q11 may be relatively decreased by a constant reference value $V_{ref}$ and a relatively large resistance value (R11+R12), and the bias current $I_{bias}$ provided through the second transistor Q12 may be decreased. Therefore, according to the description above, the gm may be decreased. As a result, the noise characteristics may be improved.

On the contrary, when the magnitude of the radio frequency signal is relatively high, the mode voltage $V_{mod}$ may be an on-level voltage. As a result, the first switch SW1 may be turned on. When the first switch SW1 is turned on, a resistance value may be determined by the second resistor R12 of the resistor circuit 211, the internal current flowing through the first transistor Q11 may be relatively increased by a constant reference value $V_{ref}$ and a relatively small resistance value R12, and the bias current $I_{bias}$ provided through the second transistor Q12 may be increased. Therefore, according to the description above, the gm may be increased. As a result, the linearity characteristics may be improved.

Additionally, the current generating circuit 212 may further include a first capacitor C11. The first capacitor C11 may be connected between the control terminal of the first transistor Q11 and the ground, and may bypass the radio frequency signal introduced through the bias transfer circuit 230 to the ground, such that the current generating circuit 212 may perform a more stable operation.

Figure 4:
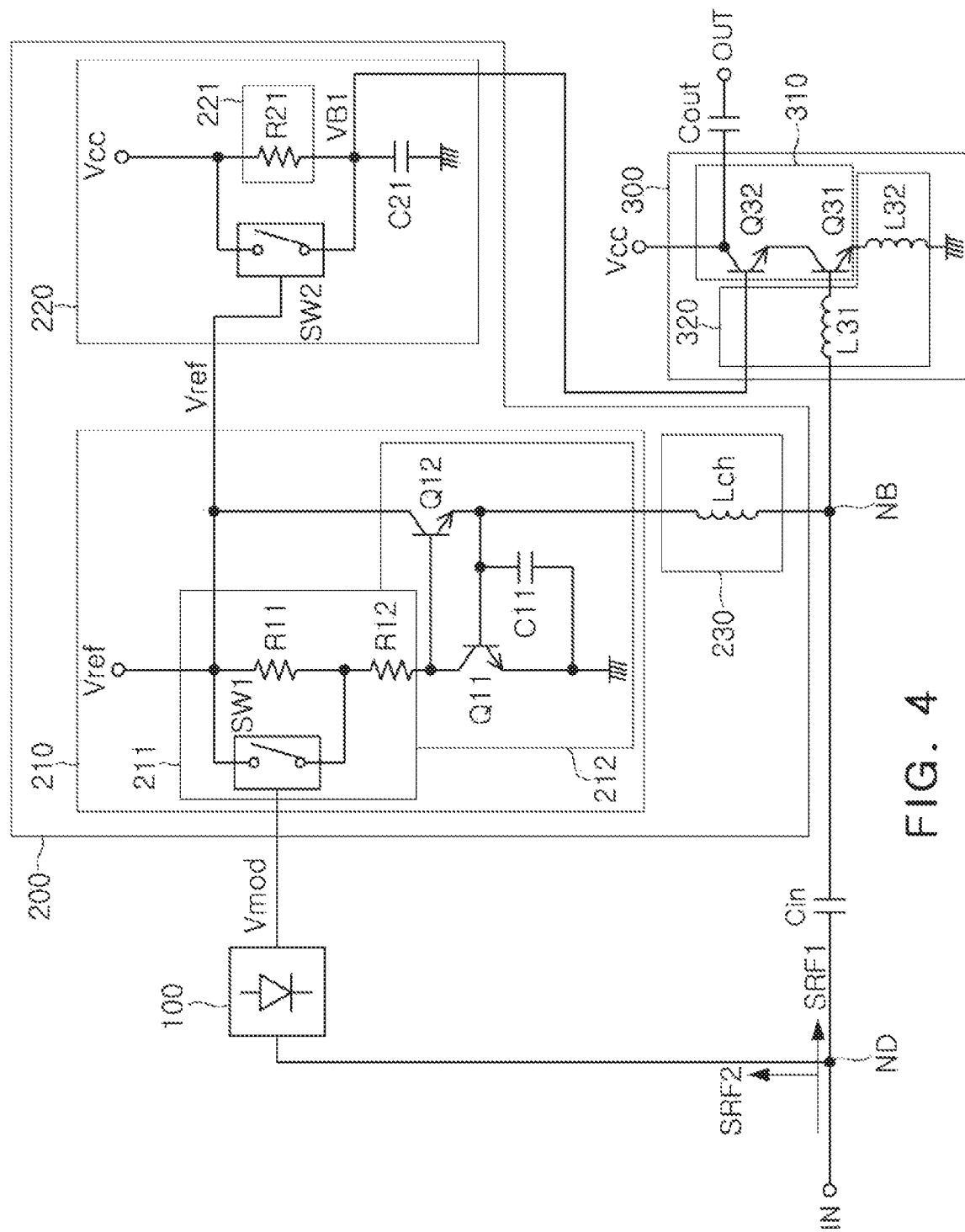
FIG. 4 is a diagram illustrating an example of an amplifying circuit in accordance with one or more embodiments.

FIG. 4 is a diagram illustrating an example of an amplifying circuit in accordance with one or more embodiments.

Referring to FIG. 4, the amplifying circuit 300 may include an amplifying transistor circuit 310 and an impedance matching circuit 320.

The amplifying transistor circuit 310 may include a first amplifying transistor Q31 and a second amplifying transistor Q32 that are connected in a cascode structure between the power source voltage $V_{cc}$ terminal and the ground. The first amplifying transistor Q31 may amplify the radio frequency signal, and the second amplifying transistor Q32 may output the amplified radio frequency signal.

The impedance matching circuit 320 may include a first inductor L31 connected to an input node of the first amplifying transistor Q31, and a second inductor L32 connected to a ground node of the first amplifying transistor Q31.

In a non-limiting example, the first inductor L31 and the second inductor L32 may match impedance between a signal line and the amplifying transistor circuit 310 in the corresponding frequency band, and the second inductor L32 may perform a degeneration function.

Figure 5:
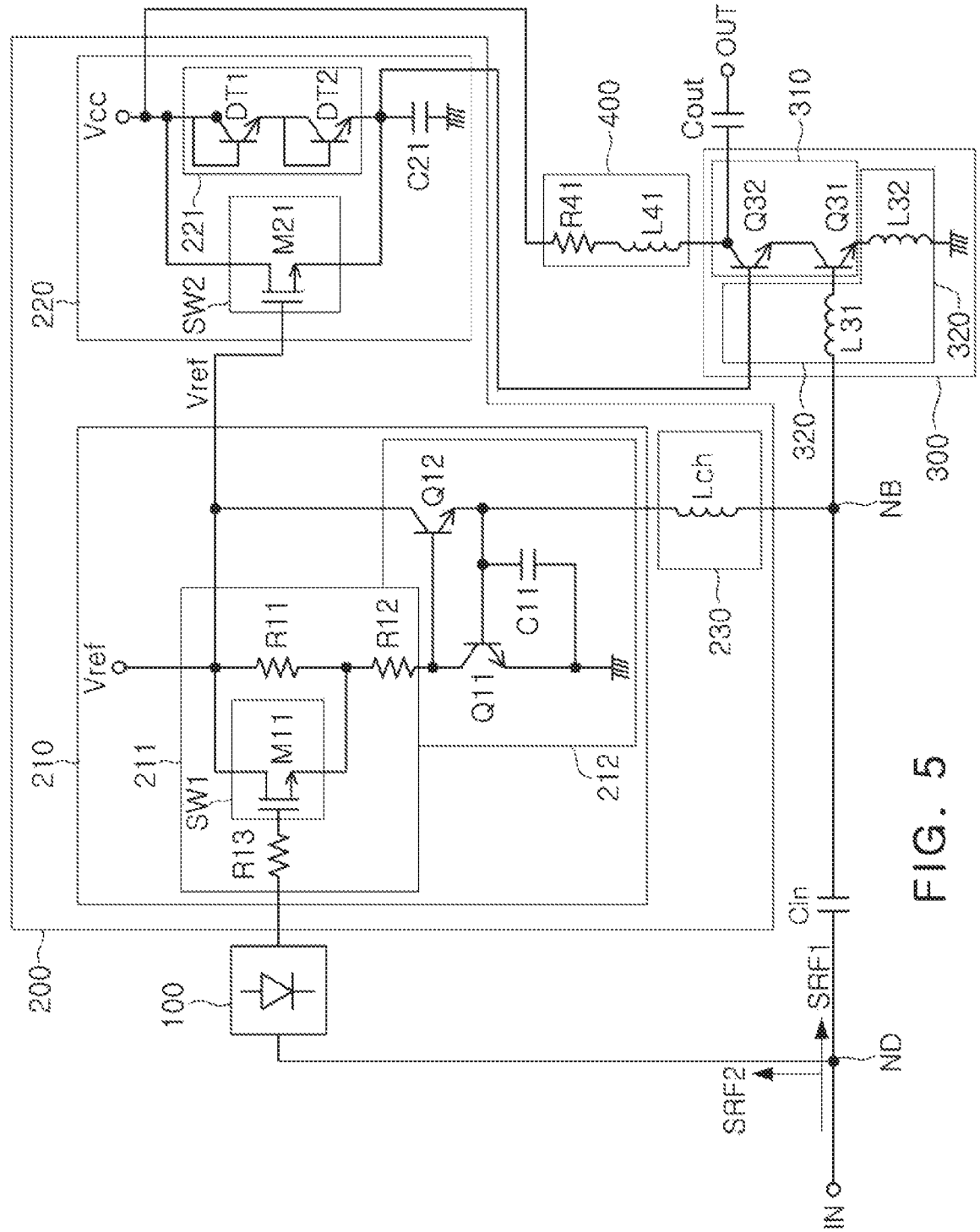
FIG. 5 is a diagram illustrating an example of a circuit of an amplifier in accordance with one or more embodiments.

FIG. 5 is a diagram illustrating an example of a circuit of an amplifier in accordance with one or more embodiments.

Referring to FIG. 5, as an example, the voltage drop circuit 221 may include first and second diode-connected transistors DT1 and DT2. The first and second diode-connected transistors DT1 and DT2 may be connected in series between the power source voltage $V_{cc}$ terminal and the output node $N_o$ of the bias voltage circuit 220, and may drop the power source voltage $V_{cc}$ by a constant voltage 2*Vth determined by the first and second diode-connected transistors DT1 and DT2 to provide the bias voltage VB1.

The bias voltage circuit 220 may decrease the power source voltage $V_{cc}$ by a predetermined voltage when the power source voltage $V_{cc}$ is a set voltage or more and may supply the decreased power source voltage $V_{cc}$ as the first bias voltage VB1. The voltage bias voltage circuit 220 may supply the power source voltage $V_{cc}$ as the first bias voltage VB1 when the power source voltage $V_{cc}$ is less than the set voltage. As an example, the set voltage may be determined as in Equation 1 below.

$$\text{Set Voltage} = V\text{erf} + V\text{drop} - V\text{th}$$ Equation 1:

In Equation 1, Verf is a reference voltage input to a control terminal of the second switch SW2. Vdrop is a drop voltage by the voltage drop circuit 221. Vth is a threshold voltage when the second switch SW2 is constituted by a field effect transistor (FET).

As an example, although not illustrated in the instant example, when the second switch SW2 is constituted by the field effect transistor (FET), a bias resistor may be added between the reference voltage $V_{ref}$ terminal and a gate of the field effect transistor (FET) of the second switch SW2.

Additionally, the amplifier may further include an output load circuit 400. The output load circuit 400 may include a resistor R41 and a coil L41 that are connected in series between the power source voltage $V_{cc}$ terminal and the amplifying transistor circuit 310.

The resistor R41 may contribute to a gain of the amplifying circuit 300, the coil L41 may perform a RF choke function, and the resistor R41 and the coil L41 may contribute to an output impedance matching for the corresponding frequency band.

On the other hand, referring to FIG. 5, the amplifying circuit 300 may include the first and second amplifying transistors Q31 and Q32 of the cascode structure to have a high voltage gain and input/output isolation characteristics. The amplifying circuit 300 may be applied with an NPN transistor exclusively for 0.24 μm LNA, which is advantageous for low noise characteristics. As an example, a size of the NPN transistor may be set to an optimum value that may be taken between appropriate trade-offs in consideration of characteristics such as voltage gain, noise characteristics, and current consumption.

in a non-limiting example, the amplifier according to the examples may be a low noise amplifier. In this example, the amplifier may implement a mode switching function to satisfy both low noise characteristics and high linearity characteristics, and may employ a choke inductor $L_{ch}$ in the bias transfer circuit 230 to use an inductive bias feed, thereby supplying the bias current. In the example in which the inductive bias feed employing the choke inductor $L_{ch}$ is used, even though a high radio frequency signal is applied, the linearity characteristics may be improved because a decrease in a base-emitter voltage $V_{be}$ due to an increase of a base-emitter current $I_{be}$ of the first amplifying transistor Q31 of the amplifying circuit may be suppressed, and the amplifier may have the low noise characteristics because resistance components at the input terminal of the amplifying circuit 300 may be significantly reduced.

In the bias current circuit 210 according to the example, the first switch SW1 that may switch the mode according to the magnitude of the input radio frequency is operated, such that the bias current $I_{bias}$ applied to the base of the first amplifying transistor Q31 of the amplifying circuit 300 may be adjusted. As an example, when the magnitude of the radio frequency signal is relatively small, the mode voltage $V_{mod}$ may become an off-level and the first switch may be turned off, such that the bias current $I_{bias}$ of about 35 μA may be applied. On the contrary, when the magnitude of the radio frequency signal is relatively large, the mode voltage $V_{mod}$ may become an on-level and the first switch may be turned on, such that the bias current $I_{bias}$ of about 95 μA may be applied. That is, the noise characteristics may be optimized by reducing an operating current at a low input level and the amplifier may have the high linearity characteristics by increasing the operating current at a high input level.

Figure 6:
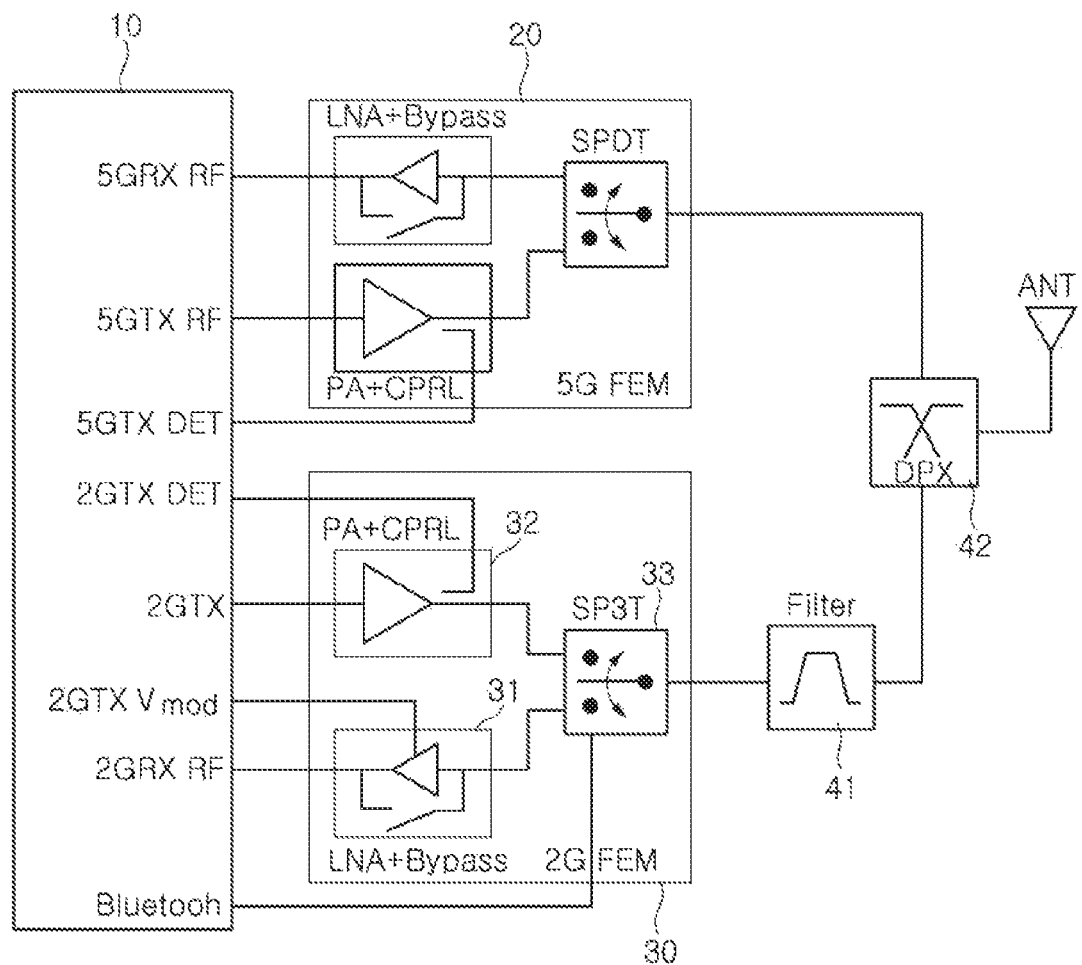
FIG. 6 is a diagram illustrating an example in which the amplifier is applied to a front-end integrated circuit in accordance with one or more embodiments.

FIG. 6 is a diagram illustrating an example in which the amplifier is applied to a front-end integrated circuit of a mobile device in accordance with one or more embodiments.

As illustrated in FIG. 6, the amplifier may be applied to a front-end integrated circuit (FEIC).

The FEIC illustrated in FIG. 6 may include a communications IC 10, a G5 front-end 20, a 2G front-end 30, a filter 41, and a diplexer 42.

The 2G front-end 30 may include a low noise amplifying circuit 31 having a bypass path, a power amplifier circuit 32 having a coupler, and an SP3T switch 33.

As an example, the bias circuit 200 and the amplifying circuit 300 discussed with regard to FIGS. 1-5 may be included in the low noise amplifying circuit 31, and the detection circuit 100 in the example may be included in the communications IC 10.

As set forth above, according to the examples, the bias circuit and the amplifier may implement the SiGe BiCMOS process and operate in the multi-mode in which the operation mode is automatically switched according to the magnitude of the input RF signal, such that low noise characteristics and high linearity characteristics may be selectively driven.

Additionally, the bias circuit and the amplifier may be operable even at the low voltage, may have low power characteristics, and may be suitable for WLAN 802.11ax based devices. As described above, the operation mode may be automatically switched according to the magnitude of the RF signal, such that the bias circuit and the amplifier may exhibit optimum performance even when the magnitude of the input RF signal varies.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit comprising:
a bias current circuit configured to vary a resistance value in response to a mode voltage determined based on a magnitude of an input radio frequency signal, and generate a bias current that is controlled based on the variation of the resistance value;
a bias voltage circuit configured to generate a bias voltage that is adjusted based on a change in a power source voltage, and supply the bias voltage to an amplifying circuit; and
a bias transfer circuit configured to supply the bias current to a base node of the amplifying circuit, and block an input of the radio frequency signal from the base node.

2. The bias circuit of claim 1, wherein the bias current circuit comprises:
a resistor circuit configured to have a resistance value that is varied based on the mode voltage; and
a current generating circuit configured to generate the bias current based on an internal current determined by the resistance value and a reference voltage.

3. The bias circuit of claim 2, wherein the resistor circuit comprises:
a first resistor and a second resistor connected in series between a reference voltage terminal and the current generating circuit; and
a first switch that is connected in parallel with one of the first resistor and the second resistor, and is configured to switch to an on-state or an off-state based on the mode voltage.

4. The bias circuit of claim 2, wherein the current generating circuit comprises a first transistor that has a first terminal connected to the resistor circuit, a second terminal connected to a ground, and a control terminal connected to the bias transfer circuit.

5. The bias circuit of claim 2, wherein the current generating circuit comprises:
a first transistor that has a first terminal connected to the resistor circuit, a second terminal connected to a ground, and a control terminal connected to the bias transfer circuit; and
a second transistor that has a first terminal connected to a reference voltage terminal, a second terminal connected to the bias transfer circuit, and a control terminal connected to the first terminal of the first transistor.

6. The bias circuit of claim 5, wherein the bias transfer circuit comprises a choke inductor connected between the bias current circuit and the base node of the amplifying circuit, and
the current generating circuit further comprises a first capacitor connected between the control terminal of the first transistor and the ground.

7. The bias circuit of claim 5, wherein the first switch is a field effect transistor (FET) that is configured to turn off when the magnitude of the input radio frequency signal is lower than a reference value, and is configured to turn on when the magnitude of the input radio frequency signal is higher than the reference value, based on the mode voltage.

8. An amplifier comprising:
a detection circuit configured to output a mode voltage based on a magnitude of an input radio frequency signal;
a bias circuit configured to generate a bias current based on the mode voltage; and
an amplifying circuit configured to receive the bias current,
wherein the bias circuit comprises:
a bias current circuit configured to vary a resistance value based on the mode voltage, and generate a bias current that is controlled based on the variation of the resistance value;
a bias voltage circuit configured to generate a bias voltage that is adjusted based on a change in a power source voltage; and
a bias transfer circuit configured to supply the bias current to a base node of the amplifying circuit, and block an input of the radio frequency signal from the base node.

9. The amplifier of claim 8, wherein the bias current circuit comprises:
 a resistor circuit configured to have a resistance value that is varied based on the mode voltage; and
 a current generating circuit configured to generate the bias current based on an internal current determined by the resistance value and a reference voltage.

10. The amplifier of claim 9, wherein the resistor circuit comprises:
 a first resistor and a second resistor connected in series between a reference voltage terminal and the current generating circuit; and
 a first switch connected in parallel with one of the first resistor and the second resistor and is configured to switch to an on-state or an off-state based on the mode voltage.

11. The amplifier of claim 9, wherein the current generating circuit comprises a first transistor that has a first terminal connected to the resistor circuit, a second terminal connected to a ground, and a control terminal connected to the bias transfer circuit.

12. The amplifier of claim 9, wherein the current generating circuit comprises:
 a first transistor that has a first terminal connected to the resistor circuit, a second terminal connected to a ground, and a control terminal connected to the bias transfer circuit; and
 a second transistor that has a first terminal connected to a reference voltage terminal, a second terminal connected to the bias transfer circuit, and a control terminal connected to the first terminal of the first transistor.

13. The amplifier of claim 12, wherein the bias transfer circuit comprises a choke inductor connected between the bias current circuit and a base node of the amplifying circuit, and the current generating circuit further comprises a first capacitor connected between the control terminal of the first transistor and the ground.

14. The amplifier of claim 10, wherein the amplifying circuit comprises:
 an amplifying transistor circuit comprising a first amplifying transistor and a second amplifying transistor that are connected in a cascode structure between a power source voltage terminal and a ground, the first amplifying transistor is configured to amplify the radio frequency signal, and the second amplifying transistor is configured to output the amplified radio frequency signal; and
 an impedance matching circuit comprising a first inductor connected to an input node of the first amplifying transistor, and a second inductor connected to a ground node of the first amplifying transistor.

15. The amplifier of claim 13, wherein the bias voltage circuit comprises:
 a voltage drop circuit connected between a power source voltage terminal and an output node of the bias voltage circuit;
 a second capacitor connected between the output node of the bias voltage circuit and the ground; and
 a second switch connected in parallel to the voltage drop circuit and configured to switch to an on-state or an off-state based on a difference voltage between a reference voltage and a voltage of the output node.

16. The amplifier of claim 15, wherein the voltage drop circuit comprises first and second diode-connected transistors connected in series between the power source voltage terminal and the output node of the bias voltage circuit.

* * * * *